United States Patent
Yoon et al.

(10) Patent No.: US 8,691,339 B2
(45) Date of Patent: Apr. 8, 2014

(54) EVAPORATING METHOD FOR FORMING THIN FILM

(71) Applicant: Samsung Display Co., Ltd., Yongin (KR)

(72) Inventors: Ji-Hwan Yoon, Yongin (KR); Kwan-Hee Lee, Yongin (KR); Jae-Hyun Kwak, Yongin (KR); Dong-Hun Kim, Yongin (KR); Min-Seung Chun, Yongin (KR); Jung-Ha Son, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/029,781

(22) Filed: Sep. 17, 2013

(65) Prior Publication Data

US 2014/0017395 A1    Jan. 16, 2014

Related U.S. Application Data

(60) Continuation of application No. 13/327,714, filed on Dec. 15, 2011, and a division of application No. 12/206,785, filed on Sep. 9, 2008, now Pat. No. 8,211,233.

(30) Foreign Application Priority Data

Mar. 11, 2008   (KR) .................. 10-2008-0022592

(51) Int. Cl.
*C23C 16/00*   (2006.01)
*B05D 5/06*    (2006.01)

(52) U.S. Cl.
USPC .................. 427/255.5; 427/248.1; 427/255.6

(58) Field of Classification Search
None
See application file for complete search history.

(56) References Cited

U.S. PATENT DOCUMENTS

| | | | |
|---|---|---|---|
| 4,233,937 | A | 11/1980 | Steube |
| 4,416,217 | A | 11/1983 | Nakamura et al. |

(Continued)

FOREIGN PATENT DOCUMENTS

| | | | |
|---|---|---|---|
| JP | 51-33779 | | 3/1976 |
| JP | 2004-111305 | * | 4/2004 |

(Continued)

OTHER PUBLICATIONS

KIPO Office Action dated Nov. 23, 2009, for Korean Priority Patent Application No. 10-2008-0022592, 3 pages.

(Continued)

*Primary Examiner* — Joseph Miller, Jr.
(74) *Attorney, Agent, or Firm* — Christie, Parker & Hale, LLP

(57) ABSTRACT

A method of forming a film on a substrate includes depositing first and second evaporating source materials respective from first and second evaporating sources onto the substrate while moving the evaporating sources together with respect to the substrate, the first and second evaporating source materials being different from each other and positioned to provide a non-overlapping deposition region of the first evaporating source material, an overlapping deposition region of the first and second evaporating source materials and a non-overlapping deposition region of the second source material such that when the evaporating sources are moved, a film is formed to include a first layer that is a deposition of only the first evaporating source material, a second layer that is a deposition of a mixture of the first evaporating source material and the second evaporating source material and a third layer that is a deposition of only the second source material.

16 Claims, 4 Drawing Sheets

(56) References Cited

U.S. PATENT DOCUMENTS

| | | | |
|---|---|---|---|
| 5,556,472 | A | 9/1996 | Nakamura et al. |
| 6,454,861 | B1 | 9/2002 | Chaleix et al. |
| 2002/0041926 | A1 | 4/2002 | Miyashita et al. |
| 2003/0194484 | A1 | 10/2003 | Yamazaki et al. |
| 2003/0221620 | A1 | 12/2003 | Yamazaki |
| 2005/0126493 | A1 | 6/2005 | Jeong |
| 2007/0178225 | A1 | 8/2007 | Takanosu et al. |

FOREIGN PATENT DOCUMENTS

| | | |
|---|---|---|
| JP | 2007-66564 | 3/2007 |
| KR | 10-0773403 | 11/2007 |

OTHER PUBLICATIONS

Japanese Office action dated Nov. 22, 2011, for Japanese Patent application 2009-015566, as well as JP 2004-111305, 2 pages.

* cited by examiner

EVAPORATING METHOD FOR FORMING THIN FILM

CROSS-REFERENCE TO RELATED APPLICATION

This application is a continuation of U.S. patent application Ser. No. 13/327,714, filed on Dec. 15, 2011, which is a divisional of U.S. patent application Ser. No. 12/206,785, filed on Sep. 9, 2008, now U.S. Pat. No. 8,211,233, which claims priority to and the benefit of Korean Patent Application No. 10-2008-0022592, filed on Mar. 11, 2008 in the Korean Intellectual Property Office, the entire contents of all of which are incorporated herein by reference.

BACKGROUND OF THE INVENTION

1. Field of the Invention

Aspects of the present invention relate to a method of forming a thin film, and more particularly, to an evaporating method for forming a thin film, wherein various types of multi-layer films can be formed on an object to be processed.

2. Description of the Related Art

An organic thin film including an emission material layer in a flat-panel display device, such as an organic light emitting display (OLED) device, is typically formed using a thin-film evaporation process in which a material to form the organic thin film is evaporated in vacuum conditions.

Typically, only a single thin-film is obtained by performing the thin-film evaporation process once. Therefore, in the case of an OLED device, if it is desired to stack multiple layers in a composite structure, such as in an organic thin film including an emission material layer, the evaporation process is repeated multiple times according to the total number of the multiple layers. Therefore, a process of forming multiple layers may be time-consuming.

To resolve this problem, Japanese Patent Publication No. 2004-111305 discloses an evaporating method for forming an organic thin film, wherein two evaporating sources are sequentially moved toward the lower side of a target so that organic thin films are sequentially stacked. However, in this described method, deposition from one evaporation source is performed only after completing deposition from another evaporation source within one chamber. Therefore, although the described method provides an advantage that deposition is performed in one chamber, such that it is not necessary to move the target from a chamber, the method still requires two evaporating operations, and thus the total evaporation time used to form the organic thin film is not reduced. Also, if a film is a type that is formed by mixing two different evaporating source materials, such as a host material and a dopant material, residue gases from the evaporating source materials used in a first evaporating operation may remain within the chamber after the first evaporating operation is over. Thus, the evaporating source material for forming a film may be corrupted in the second evaporating operation due to the residue gases from the first evaporating operation. Therefore, the chamber has to be ventilated between the first and second evaporating operations.

SUMMARY OF THE INVENTION

Aspects of the present invention provide a method of forming a thin-film, by which a plurality of multi-layer organic films can be formed in single process.

According to an embodiment of the present invention, there is provided a method of forming a multilayer film on a substrate, the method comprising: depositing a first evaporating source material from a first evaporating source and a second evaporating source material from a second evaporating source onto the substrate while moving the first evaporating source and the second evaporating source together with respect to the substrate, wherein the first evaporating source material and the second evaporating source material are different from each other, wherein the first evaporating source and the second evaporating source are positioned with respect to each other to provide a non-overlapping deposition region of the first evaporating source material, an overlapping deposition region of the first evaporating source material and the second evaporating source material and a non-overlapping deposition region of the second source material such that when the first evaporating source and the second evaporating source are moved together with respect to the substrate, a multilayer film is formed comprising a first layer that is a deposition of only the first evaporating source material, a second layer that is a deposition of a mixture of the first evaporating source material and the second evaporating source material and a third layer that is a deposition of only the second source material.

According to another embodiment of the present invention, there is provided a method of forming a multilayer film on a substrate, the method comprising: depositing a first evaporating source material from a first evaporating source, a second evaporating source material from a second evaporating source and a third evaporating source material from a third evaporating source onto the substrate while moving the first evaporating source, the second evaporating source and the third evaporating source together with respect to the substrate, wherein the first evaporating source material, the second evaporating source material and the third evaporating source are different from each other, wherein the first evaporating source, the second evaporating source and the third evaporating source are positioned with respect to each other to provide a non-overlapping deposition region of the first evaporating source material, an overlapping deposition region of the first evaporating source material and the second evaporating source material, a non-overlapping deposition region of the second evaporating source material, an overlapping deposition region of the second evaporating source material and the third evaporating source material and a non-overlapping region of the third source material such that when the first evaporating source, the second evaporating source and the third evaporating source are moved together with respect to the substrate, a multilayer film is formed comprising a first layer that is a deposition of only the first evaporating source material, a second layer that is a deposition of a mixture of the first evaporating source material, a third layer that is a deposition of only the second evaporating source material, a fourth layer that is a deposition of a mixture of the second evaporating source material and the third evaporating source material and a fifth layer that is a deposition of only the third evaporating source material.

According to another embodiment of the present invention, there is provided a method of forming a multilayer film on a substrate, the method comprising: depositing a first evaporating source material from a first evaporating source, a second evaporating source material from a second evaporating source and a third evaporating source material from a third evaporating source onto the substrate while moving the first evaporating source, the second evaporating source and the third evaporating source together with respect to the substrate, wherein the first evaporating source material, the second evaporating source material and the third evaporating source material are different from each other, wherein the first evaporating source, the second evaporating source and the third evaporating source are positioned with respect to each other to provide an overlapping deposition region of the first evaporating source material and the second evaporating source material and an overlapping deposition region of the second evaporating source material and the third evaporating source material such that when the first evaporating source, the second evaporating source and the third evaporating source are moved together with respect to the substrate, a multilayer film is formed comprising a first layer that is a deposition of a mixture of the first evaporating source material and the second evaporating source material and a second layer that is a deposition of a mixture of the third evaporating source material and the second evaporating source material.

According to another embodiment of the present invention, there is provided a method of forming a multilayer thin film, the method including: preparing a first evaporating source evaporating a first evaporating source material onto a first deposition region and a second evaporating source evaporating a second evaporating source material onto a second deposition region, wherein the first evaporating source material and the second evaporating source material are different from each other; adjusting the first evaporating source and the second evaporating source in order to obtain a first overlapping region in which the first deposition region and the second deposition region overlap each other, driving the first evaporating source and the second evaporating source, depositing the first evaporating source material and the second evaporating source material onto a portion of an object to be processed, and moving the first evaporating source and the second evaporating source from a first end of the object to a second end of the object to form a multilayer thin film comprising a first layer that is a deposition of only the first evaporating source material, a second layer that is a deposition of a mixture of the first evaporating source material and the second evaporating source material and a third layer that is a deposition of only the second source material.

According to aspects of the present invention, the method may further comprise moving the first evaporating source and the second evaporating source from a second end of the object to a first end of the object to form a fourth layer that is a deposition of only the second evaporating source material, a fifth layer that is a deposition of a mixture of the first evaporating source material and the second evaporating source material and a sixth layer that is a deposition of only the first source material.

According to aspects of the present invention, the first and second evaporating sources may move at the same speed.

The method may further include preparing a third evaporating source evaporating a third evaporating source material, which differs from the first and second evaporating source materials, onto a third deposition region, adjusting the third evaporating source in order to obtain a second overlapping region in which the third deposition region overlaps with either the first deposition region or the second deposition region, driving the third evaporating source, depositing the third evaporating source material onto a portion of an object to be processed, and moving the third evaporating source from the first end of the object to the second end of the object with the first evaporating source and the second evaporating source such that the multilayer thin film further comprises a fourth layer that is a deposition of a mixture of the second evaporating source material and the third evaporating source material and a fifth layer that is a deposition of only the third evaporating source material.

According to an aspect of the present invention, the method further comprises moving the first evaporating source, the second evaporating source and the third evaporating source from a second end of the object to a first end of the object to form a sixth layer that is a deposition of only the third evaporating source material, a seventh layer that is a deposition of a mixture of the third evaporating source material and the second evaporating source material, an eighth layer that is a deposition of only the second source material, a ninth layer that is a deposition of a mixture of the second evaporating source material and the first evaporating source material, an tenth layer that is a deposition of only the first source material.

According to another embodiment of the present invention, there is provided a method of forming a multilayer thin film, comprising: preparing a first evaporating source evaporating a first evaporating source material onto a first deposition region, a second evaporating source evaporating a second evaporating source material onto a second deposition region, and a third evaporating source that evaporates a third evaporating source material onto a third deposition region wherein the first evaporating source material, the second evaporating source material and the third evaporating source material are different from each other; adjusting the first evaporating source, the second evaporating source and the third evaporating source in order to obtain a first overlapping region in which the second deposition region completely overlaps the first deposition region and a second overlapping region in which the second deposition region completely overlaps the third deposition region; driving the first evaporating source, the second evaporating source and the third evaporating source; depositing the first evaporating source material, the second evaporating source material and the third evaporating source material onto a portion of an object to be processed; and moving the first evaporating source, the second evaporating source and the third evaporating source from a first end of the object to a second end of the object to form a multilayer thin film comprising a first layer that is a deposition of a mixture of the first evaporating source material and the second evaporating source material and a second layer that is a deposition of a mixture of the second evaporating source material and the third evaporating source material.

According to an aspect of the present invention, the first overlapping region and the second overlapping region may be sequentially formed from the first end of the object to be processed.

According to an aspect of the present invention, the first through third evaporating sources may move at the same speed.

According to another embodiment of the present invention, there is provided a deposition apparatus that forms a multilayer thin film on a substrate, comprising: a first evaporating source that evaporates a first evaporating source material onto a first deposition region, and a second evaporating source that evaporates a second evaporating source material onto a second deposition region, wherein the first evaporating source and the second evaporating source are positioned such that the first deposition region and the second deposition region partially overlap to form a first overlapping region, and wherein the first evaporating source and the second evaporating source are coupled to move together in a direction with respect to the substrate to form a multilayer thin film.

According to another embodiment of the present invention, there is provided a deposition apparatus that forms a multilayer thin film on a substrate, comprising: a first evaporating source that evaporates a first evaporating source material onto a first deposition region, a second evaporating source that evaporates a second evaporating source material onto a second deposition region, and a third evaporating source that evaporates a third evaporating source material onto a third deposition region, wherein the first evaporating source and the second evaporating source are positioned such that the first deposition region and the second deposition region partially overlap to form a first overlapping region, wherein the second evaporating source and the third evaporating source are positioned such that the second deposition region and the third deposition region partially overlap to form a second overlapping region and wherein the first evaporating source, the second evaporating source and the third evaporating source are coupled to move together in a direction with respect to a substrate to form a multilayer thin film on the substrate.

According to another embodiment of the present invention, there is provided a deposition apparatus comprising: a first evaporating source that evaporates a first evaporating source material onto a first deposition region, a second evaporating source that evaporates a second evaporating source material onto a second deposition region, and a third evaporating source that evaporates a third evaporating source material onto a third deposition region, wherein the first evaporating source and the second evaporating source are positioned such that the second deposition region completely overlaps the first deposition region to form a first overlapping region, wherein the second evaporating source and the third evaporating source are positioned such that the second deposition region completely overlaps the third deposition region to form a second overlapping region and wherein the first evaporating source, the second evaporating source and the third evaporating source are coupled to move together in a direction with respect to a substrate to form a multilayer thin film on the substrate.

According to another embodiment of the present invention, there is provided a deposition apparatus comprising: a plurality of evaporating sources that evaporates source material onto the substrate, each evaporating source depositing a different source material, wherein the evaporating sources are positioned to form overlapping deposition regions and/or non-overlapping deposition regions and wherein the evaporating sources are to move together in a direction with respect to a substrate to form a multilayer film on the substrate.

According to aspects of the present invention, a multi-layer organic film in which various material layers are stacked can be formed in single evaporation process. Thus, there is no time loss between operations of stacking the organic films, so that layers can be efficiently stacked.

According to aspects of the present invention, since layers within a multi-layer organic film are formed successively, it is possible to obtain organic films with good quality without ventilating a chamber between operations of stacking layers in an organic film.

Also, aspects of the present invention are advantageous for forming large-sized substrates.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become more apparent and more readily appreciated from the following description of the embodiments, taken in conjunction with the accompanying drawings of which.

DETAILED DESCRIPTION OF THE EMBODIMENTS

Figure 1:
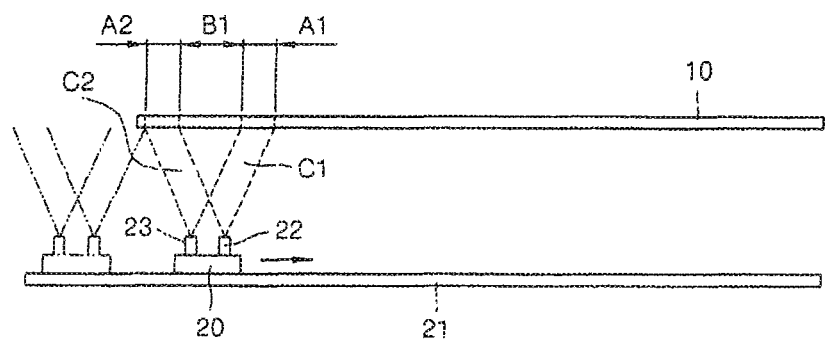
FIG. 1 is a sectional view schematically showing an evaporation system performing a method of forming a thin-film, according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

FIG. 1 is a sectional view schematically showing an evaporation system performing a method of forming a thin-film, according to an embodiment of the present invention.

Although a chamber is not shown in FIG. 1 for convenience of explanation, all components shown in FIG. 1 may be disposed in a chamber maintained at an appropriate vacuum level. Alternatively, the chamber may be maintained in an inert atmosphere including inert gases.

A substrate 10, which is an object to be processed, is disposed within the chamber. The substrate 10 may be a substrate for a flat-panel display device, and more generally, any substrate having a large surface area, such as a mother glass on which a plurality of flat-panel display devices can be formed.

A first evaporating source 22 and a second evaporating source 23 are disposed on a surface to face the substrate 10, as shown in FIG. 1. The first evaporating source 22 and the second evaporating source 23 may be disposed on a base 20, and the base 20 may be disposed on a guide rail 21 placed in the chamber such that the base 20 can move along the guide rail 21. In this case, the base 20 may be connected to a separate driving unit (not shown). It is to be understood that the disposition of the first evaporating source and the second evaporating source can be different from what is shown in FIG. 1 and any structure moves the first evaporating source and the second evaporating source together, that is, in the same direction and at the same time, can be used.

As shown in FIG. 1, the first evaporating source 22 and the second evaporating source 23 are disposed at a predetermined distance apart from each other and are disposed to move in the same direction.

As shown in FIG. 1, the first evaporating source 22 deposits a first evaporating source material onto the substrate 10 by conically evaporating the first evaporating source material onto the substrate 10. The conical projection of the first evaporating source material is designated by the reference character C1. The second evaporating source 23 deposits a second evaporating source material onto the substrate 10 by conically evaporating the second evaporating source material onto the substrate 10. The conical projection of the second evaporating source material is designated by reference character C2. At this point, the conical projection C1 of the first evaporating source material and the conical projection C2 of the second evaporating source material partially overlap each other at a location on the substrate 10. As a result, a first non-overlapping deposition region A1 in which only the first evaporating source material is deposited and a second non-overlapping deposition region A2 in which only the second evaporating source material is deposited are formed at edges of the entire deposition region on the substrate 10. A first overlapping region B1 is formed between the first non-overlapping deposition region A1 and the second non-overlapping deposition region A2, wherein a mixture of the first evaporating source material and the second evaporating source material is deposited in the first overlapping region B1. Herein, where it is stated that only the first evaporating source material is deposited on the non-overlapping deposition region A1, or that only the second evaporating source material is deposited on the non-overlapping deposition region A2, or that only the third evaporating source material is deposited on the non-overlapping deposition region A3, it to be understood that the term "only" is not meant to exclude incidental amounts of evaporating source material from the other evaporating sources that may be present on the non-overlapping deposition region due, for example, to unavoidable inaccuracies in the deposition process.

Figure 2:
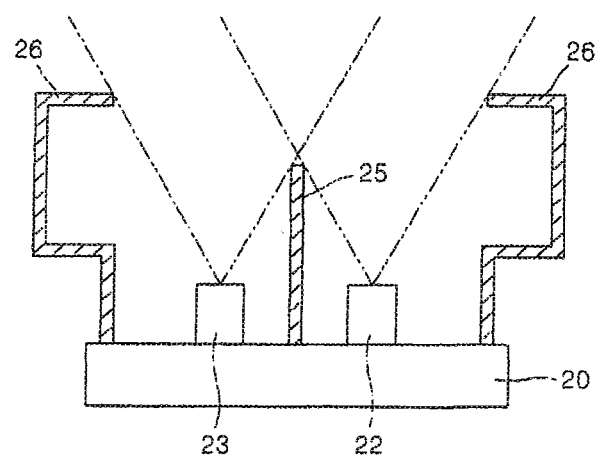
FIG. 2 is a sectional view schematically showing a configuration of the evaporating sources of FIG. 1 and angle limiting components that limit the evaporating angle of the evaporating sources.

As shown in FIG. 2, angles of the conical projections C1 and C2 of the first evaporating source 22 and the second evaporating source 23 can be controlled by angle limiting components that block the movement of the first evaporating source material and the second evaporating source material. As shown in FIG. 2, a first angle limiting component 25 is disposed between the first evaporating source 22 and the second evaporating source 23, and second angle limiting components 26 are respectively disposed laterally from the first evaporating source 22 and the second evaporating source 23.

The area of the first overlapping region B1 is determined by the vertical length of the first angle limiting component 25, and the areas of the first non-overlapping deposition region A1 and the second non-overlapping deposition region A2 are determined by the horizontal length of the second angle limiting component 26. Therefore, thicknesses of films that are to be formed at the substrate 10 can also be changed by adjusting the lengths of the first angle limiting component 25 and the second angle limiting components 26, as described below.

The first angle limiting component 25 and the second angle limiting component 26 may extend perpendicularly to a direction in which the first and second evaporating sources 22 and 23 move.

Each of the first evaporating source 22 and the second evaporating source 23 may include a plurality of crucibles that are disposed along a line for simultaneous deposition.

Figure 3:
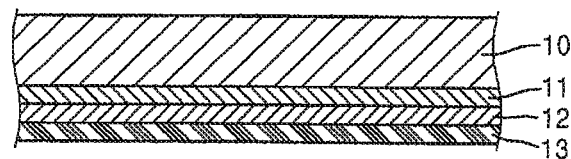
FIG. 3 is a sectional view of a thin-film formed by the evaporation system shown in FIG. 1.

Referring to FIG. 1, the evaporating sources 22 and 23 simultaneously perform deposition while moving together in a direction indicated by the arrow. As used herein, the term "moving together" refers to moving in the same direction at the same time. In the example of FIG. 1, the evaporating sources 22 and 23 perform evaporation starting from the leftmost end of the substrate 10. Thus, the first non-overlapping deposition region A1, the first overlapping region B1, and the second non-overlapping deposition region A2 are sequentially formed on the substrate 10. Therefore, as shown in FIG. 3, a first film 11 made of the first evaporating source material deposited in the first non-overlapping deposition region A1 is formed on the surface of the substrate 10, and a second film 12 made of a mixture of the first evaporating source material and the second evaporating source material is formed on the surface of the first film 11 as the first overlapping region B1 advances along the substrate 10. Then, as the second non-overlapping deposition region A2 advances along the substrate 10, a third film 13 made of the second evaporating source material is formed on the surface of the second film 12.

The sequential stacking of the first through third films 11 through 13 can be completed simultaneously in one pass as the evaporating sources 22 and 23 move along the substrate. Therefore, the forming of films becomes simpler and quicker. Also, since operations of forming films are performed almost simultaneously, it is not necessary to ventilate the chamber between the formation of the first film 11 and the formation of the second film 12 or between the formation of the second film 12 and the formation of the third film 13.

The thicknesses of the first through third films 11 through 13 depend on the areas of the first non-overlapping deposition region A1, the first overlapping region B2, and the second non-overlapping deposition region A2. Therefore, as shown in FIG. 2, the thicknesses of the first through third films 11 through 13 may be controlled by selecting the lengths of the first angle limiting component 25 and the second angle limiting component 26.

Figure 4:
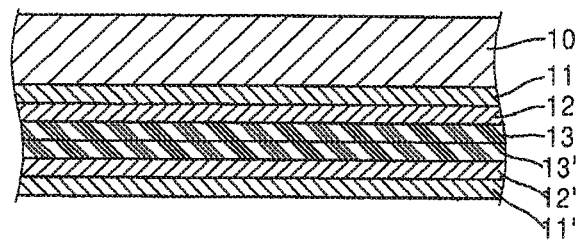
FIG. 4 is a sectional view of another thin-film formed by the evaporation system shown in FIG. 1.

As shown in FIG. 4, if the evaporating sources 22 and 23 perform the respective evaporating operations while returning to the leftmost end of the substrate 10, the first film 11, the second film 12, the third film 13, a new third film 13', a new second film 12', and a new first film 11' are sequentially formed. For example, the second evaporating source 23 may move until the second evaporating source 23 reaches the rightmost end of the substrate 10 and then return to the leftmost end of the substrate 10 to form the above structure.

Figure 5:
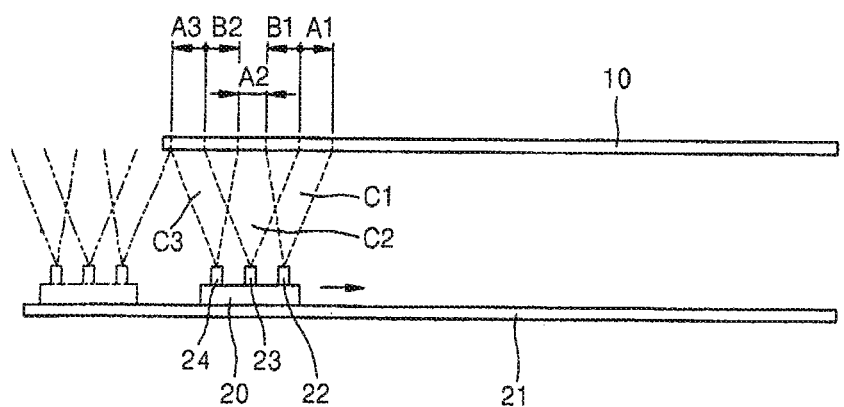
FIG. 5 is a sectional view schematically showing an evaporation system performing a method of forming a thin-film, according to another embodiment of the present invention.

FIG. 5 is a sectional view roughly showing an evaporation system performing a method of forming a thin-film, according to another embodiment of the present invention.

The evaporation system shown in FIG. 5 further includes a third evaporating source 24 next to the second evaporating source 23, as compared to the evaporation system shown in FIG. 1. As shown in FIG. 5, the third evaporating source 24 deposits a third evaporating source material onto the substrate 10 by conically evaporating the third evaporating source material onto the substrate 10. The conical projection of the third evaporating source material is designated by reference letter C3. According to FIG. 5, the conical projection C3 of the third evaporating source material and the conical projection C2 of the second evaporating source material partially overlap each other at a location on the substrate 10, so that a third non-overlapping deposition region A3 in which only the third evaporating source material is deposited and a second overlapping region B2 in which a mixture of the second evaporating source material and the third evaporating source material is deposited. Therefore, the first non-overlapping deposition region A1 in which only the first evaporating source material is deposited, the second non-overlapping deposition region A2 in which only the second evaporating source material is deposited, the third non-overlapping deposition region A3 in which only the third evaporating source material is deposited are formed on the substrate 10 in sequence. The first overlapping region B1 is located between the first non-overlapping deposition region A1 and the second non-overlapping deposition region A2, and the second overlapping region B2 is located between the second non-overlapping deposition region A2 and the third non-overlapping deposition region A3.

Figure 6:
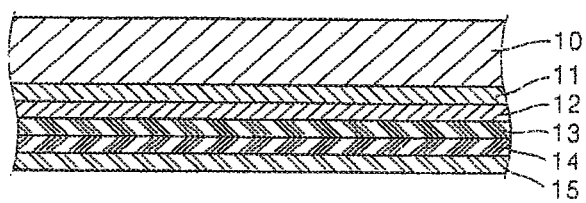
FIG. 6 is a sectional view of a thin-film formed by the evaporation system shown in FIG. 5.
Figure 7:
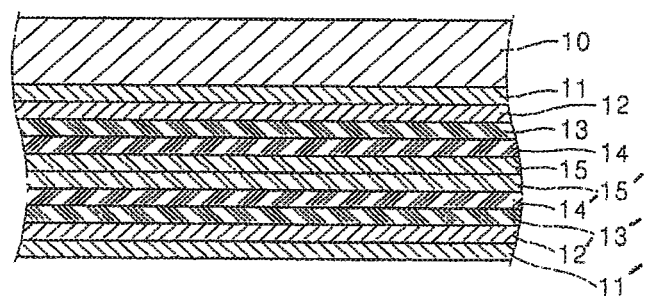
FIG. 7 is a sectional view of another thin-film formed by the evaporation system shown in FIG. 5.

In FIG. 5, the evaporating sources 22, 23, and 24 simultaneously perform deposition while moving in a direction indicated by the arrow. In the embodiment shown in FIG. 5, the evaporating sources 22, 23, and 24 perform evaporation from the leftmost end of the substrate 10, and thus the first non-overlapping deposition region A1, the first overlapping region B1, the second non-overlapping deposition region A2, the second overlapping region B2, and the third non-overlapping deposition region A3 are sequentially formed on the substrate 10. Therefore, as shown in FIG. 6, the first film 11 made of the first evaporating source material, the second film 12 made of the mixture of the first evaporating source material and the second evaporating source material, the third film 13 made of the second evaporating source material, a fourth film 14 made of a mixture of the second evaporating source material and the third evaporating source material, and a fifth film 15 made of the third evaporating source material are formed on the surface of the substrate 10 in sequence. Also, as shown in FIG. 7, if the evaporating sources 22, 23, and 24 perform evaporation while returning to the leftmost end of the substrate 10, films may be formed and stacked in sequence of the first film 11, the second film 12, the third film 13, the fourth film 14, the fifth film 15, a new fifth film 15', a new fourth film 14', a new third film 13', a new second film 12', and a new first film 11'.

Figure 8:
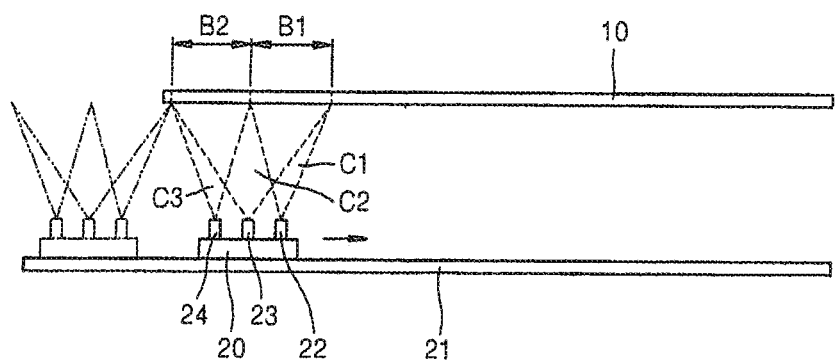
FIG. 8 is a sectional view schematically showing an evaporation system performing a method of forming a thin-film, according to another embodiment of the present invention.

FIG. 8 is a sectional view roughly showing an evaporation system performing a method of forming a thin-film, according to another embodiment of the present invention.

In the embodiment shown in FIG. 8, a first conical projection C1, a second conical projection C2, and a third conical projection C3 are controlled so that only a first overlapping region B1, in which the second deposition region completely overlaps the first deposition region, and a second overlapping region B2, in which the second deposition region completely overlaps the third deposition region, are formed on the substrate 10.

Figure 9:
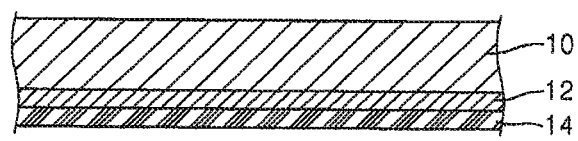
FIG. 9 is a sectional view of a thin-film formed by the evaporation system shown in FIG. 8.

As shown in FIG. 9, if the evaporating sources 22, 23, and 24 are driven to perform evaporation from the leftmost end of the substrate 10 toward the right end thereof, a first film 12 made of the mixture of the first evaporating source material and the second evaporating source material is formed on the rear surface of the substrate 10, and then a second film 14 made of the mixture of the second evaporating source material and the third evaporating source material are formed on the surface of the first film 12.

Figure 10:
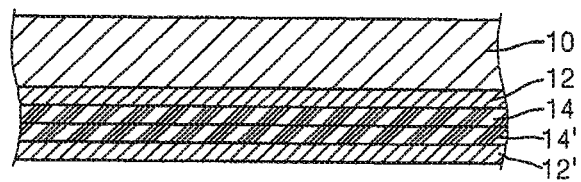
FIG. 10 is a sectional view of another thin-film formed by the evaporation system shown in FIG. 8.

As shown in FIG. 10, as the evaporating sources 22, 23, and 24 return to the leftmost end of the substrate 10 and perform evaporation, a new second film 14', made of the mixture of the second evaporating source material and the third evaporating source material, is formed again on the rear surface of the previously formed second film 14, and a new first film 12', made of the mixture of the first evaporating source material and the second evaporating source material, is formed on the new second layer 14.

The method of forming a thin-film according to aspects of the present invention is advantageous for thin-film forming operations in which a dopant material and a host material are evaporated simultaneously.

For example, with regard to the thin film shown in FIG. 3, if a host material is evaporated by the first evaporating source 22 and a dopant material is evaporated by the second evaporating source 23 simultaneously, the first film 11 may be a host layer, the second film 12 may be a layer made of a mixture of the host material and the dopant material, and the third film 13 may be a dopant layer.

Also, in case of the embodiment shown in FIG. 5, the first evaporating source 22 evaporates a first host material, the second evaporating source 23 evaporates a dopant material, and the third evaporating source 24 evaporates a second host material, simultaneously. In this case, the first film 11 may be a first host layer, the second film 12 may be a layer made of a mixture of the first host material and the dopant material, the third film 13 may be a dopant layer, the fourth film 14 may be a layer made of a mixture of the dopant material and the second host material, and the fifth film 15 may be a second host layer, in FIG. 6. This example corresponds to the situation where the first host material and the second host material can share the dopant material, and evaporation can be done with only one dopant evaporating source. Thus, overall evaporating operations can become simpler.

The method of the present embodiment may also be applied to a case where a first dopant material and a second dopant material can share a host material.

In the case of the embodiment shown in FIG. 8, when the first evaporating source 22, the second evaporating source 23, and the third evaporating source 24 respectively deposit the first host material, the dopant material, and the second host material, a mixture of the first host material and the dopant material and a mixture of the second host material and the dopant material are respectively stacked on the first film 12 and the second film 14, in sequence, in FIG. 9. In this case, the first film 12 and the second film 14, which are successively stacked, may be made of host materials different from each other and may be made of the same dopant material. Therefore, two layers made of different host materials and the same dopant material can be formed in an easy way.

If the first evaporating source 22, the second evaporating source 23, and the third evaporating source 24 respectively evaporate the first dopant material, the host material, and the second dopant material in FIG. 8, a mixture of the first dopant material and the host material and a mixture of the second dopant material and the host material may be respectively stacked on the first film 12 and the second film 14, in sequence, in FIG. 9.

Accordingly, a multi-layer organic film can be made of various combinations of a host material and a dopant material according to aspects of the present invention, and thus the method according to the present invention is useful for forming an organic layer of an organic light emitting display (OLED) device, and more specifically, for forming a light emitting layer.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of forming a multilayer film on a substrate, the method comprising:
   depositing a first evaporating source material from a first evaporating source emitting a first projection and a second evaporating source material from a second evaporating source emitting a second projection onto the substrate while moving a base in a horizontal direction, the base being attached to the first evaporating source, the second evaporating source, a first angle limiting component, and a second angle limiting component;
   limiting the first projection and the second projection with the first angle limiting component extending from the base for a first length in a vertical direction, the first angle limiting component being between the first evaporating source and the second evaporating source, the limiting of the first projection and the second projection comprising selecting the first length; and further limiting the first projection with the second angle limiting component comprising:
- a first extension extending from the base in the vertical direction, the first evaporating source being between the first angle limiting component and the first extension; and
- a second extension extending for a second length in the horizontal direction toward the first evaporating source, the further limiting of the first projection comprising selecting the second length, wherein the first evaporating source material and the second evaporating source material are different from each other, wherein the first evaporating source, the second evaporating source, the first angle limiting component, and the second angle limiting component are positioned with respect to each other and in accordance with the selected first and second lengths to provide a non-overlapping deposition region of the first evaporating source material, an overlapping deposition region of the first evaporating source material and the second evaporating source material, and a non-overlapping deposition region of the second evaporating source material such that when the base is moved in the horizontal direction, the multilayer film is formed comprising a first layer that is a deposition of only the first evaporating source material, a second layer that is a deposition of a mixture of the first evaporating source material and the second evaporating source material, and a third layer that is a deposition of only the second evaporating source material, and wherein the first and second lengths are selected to control thicknesses of the first, second, and third layers.

2. A method of forming a multilayer film on a substrate, the method comprising:

depositing a first evaporating source material from a first evaporating source emitting a first projection, a second evaporating source material from a second evaporating source emitting a second projection, and a third evaporating source material from a third evaporating source onto the substrate while moving a base in a horizontal direction, the base being attached to the first evaporating source, the second evaporating source, the third evaporating source, a first angle limiting component, and a second angle limiting component;

limiting the first projection and the second projection with the first angle limiting component extending from the base for a first length in a vertical direction, the first angle limiting component being between the first evaporating source and the second evaporating source, the limiting of the first projection and the second projection comprising selecting the first length; and further limiting the first projection with the second angle limiting component comprising:
- a first extension extending from the base in the vertical direction, the first evaporating source being between the first angle limiting component and the first extension; and
- a second extension extending for a second length in the horizontal direction toward the first evaporating source, the further limiting of the first projection comprising selecting the second length, wherein the first evaporating source material, the second evaporating source material, and the third evaporating source material are different from each other, wherein the first evaporating source, the second evaporating source, the third evaporating source, the first angle limiting component, and the second angle limiting component are positioned with respect to each other and in accordance with the selected first and second lengths to provide a non-overlapping deposition region of the first evaporating source material, an overlapping deposition region of the first evaporating source material and the second evaporating source material, a non-overlapping deposition region of the second evaporating source material, an overlapping deposition region of the second evaporating source material and the third evaporating source material, and a non-overlapping region of the third evaporating source material such that when the base is moved in the horizontal direction, the multilayer film is formed comprising a first layer that is a deposition of only the first evaporating source material, a second layer that is a deposition of a mixture of the first evaporating source material, a third layer that is a deposition of only the second evaporating source material, a fourth layer that is a deposition of a mixture of the second evaporating source material and the third evaporating source material and a fifth layer that is a deposition of only the third evaporating source material, and wherein the first and second lengths are selected to control thicknesses of the first, second, and third layers.

3. A method of forming a multilayer film on a substrate, the method comprising:

depositing a first evaporating source material from a first evaporating source emitting a first projection, a second evaporating source material from a second evaporating source emitting a second projection, and a third evaporating source material from a third evaporating source onto the substrate while moving a base in a horizontal direction, the base being attached to the first evaporating source, the second evaporating source, the third evaporating source, a first angle limiting component, and a second angle limiting component in a horizontal direction;

limiting the first projection and the second projection with the first angle limiting component extending from the base for a first length in a vertical direction, the first angle limiting component being between the first evaporating source and the second evaporating source, the limiting of the first projection and the second projection comprising selecting the first length; and further limiting the first projection with the second angle limiting component comprising:
- a first extension extending from the base in the vertical direction, the first evaporating source being between the first angle limiting component and the first extension; and
- a second extension extending for a second length in the horizontal direction toward the first evaporating source, the further limiting of the first projection comprising selecting the second length, wherein the first evaporating source material, the second evaporating source material, and the third evaporating source material are different from each other; and wherein the first evaporating source, the second evaporating source, the third evaporating source, the first angle limiting component, and the second angle limiting component are positioned with respect to each other and in accordance with the selected first and second lengths to provide an overlapping deposition region of the first evaporating source material and the second evaporating source material, and an overlapping deposition region of the second evaporating source material and the third evaporating source material such that when the base is moved in the horizontal direction, the multilayer film is formed comprising a first layer that is a deposition of a mixture of the first evaporating source material and the second evaporating source material, and a second layer that is a deposition of a mixture of the second evaporating source material and the third evaporating source material, and wherein the first and second lengths are selected to control thicknesses of the first and second layers.

4. A method of forming a multilayer thin film, the method comprising:

preparing a first evaporating source for evaporating a first evaporating source material in a first projection onto a first deposition region, and a second evaporating source for evaporating a second evaporating source material in a second projection onto a second deposition region to obtain a first overlapping region in which the first deposition region overlaps the second deposition region, wherein the first evaporating source material and the second evaporating source material are different from each other, and the first evaporating source and the second evaporating source are attached to a base together with a first angle limiting component and a second angle limiting component;

driving the base in a horizontal direction;

limiting the first projection and the second projection with the first angle limiting component extending from the base for a first length in a vertical direction, the first angle limiting component being between the first evaporating source and the second evaporating source, the limiting of the first projection and the second projection comprising selecting the first length; and further limiting the first projection with the second angle limiting component comprising:

a first extension extending from the base in the vertical direction, the first evaporating source being between the first angle limiting component and the first extension; and a second extension extending for a second length in the horizontal direction toward the first evaporating source, the further limiting of the first projection comprising selecting the second length;

depositing the first evaporating source material and the second evaporating source material onto a portion of an object to be processed;

moving the base from a first end of the object to a second end of the object to form the multilayer thin film comprising a first layer that is a deposition of only the first evaporating source material, a second layer that is a deposition of a mixture of the first evaporating source material and the second evaporating source material, and a third layer that is a deposition of only the second evaporating source material; and selecting the first and second lengths to control thicknesses of the first, second, and third layers.

5. The method of claim 4, further comprising controlling a size of the first overlapping region by adjusting the first length.

6. The method of claim 4, further comprising controlling a size of the first deposition region by adjusting the second length.

7. The method of claim 4, further comprising moving the base from the second end of the object to the first end of the object to form a fourth layer that is a deposition of only second evaporating source material, a fifth layer that is a deposition of a mixture of the first evaporating source material and the second evaporating source material and a sixth layer that is a deposition of only the first evaporating source material.

8. The method of claim 4, further comprising further limiting the second projection with a third angle limiting component attached to the base and comprising:

a third extension extending from the base in the vertical direction, the second evaporating source being between the first angle limiting component and the third extension; and a fourth extension extending for a third length in the horizontal direction toward the second evaporating source, the further limiting of the second projection comprising selecting the third length, wherein the selecting of the first and second lengths to control the thicknesses of the first, second, and third layers comprises selecting the first, second, and third lengths to control the thicknesses of the first, second, and third layers.

9. The method of claim 8, further comprising:

controlling a size of the first overlapping region by adjusting the first length;

controlling a size of the first deposition region by adjusting the second length; and controlling a size of the second deposition region by adjusting the third length.

10. The method of claim 4, further comprising:

preparing a third evaporating source for evaporating a third evaporating source material onto a third deposition region to obtain a second overlapping region in which the second deposition region overlaps the third deposition region, wherein the third evaporating source material differs from the first evaporating source material and the second evaporating source material, and the third evaporating source is attached to the base; and depositing the third evaporating source material onto a portion of the object, wherein the moving of the base from the first end of the object to the second end of the object further forms a fourth layer that is a deposition of a mixture of the second evaporating source material and the third evaporating source material, and a fifth layer that is a deposition of only the third evaporating source material.

11. The method of claim 10, further comprising moving the base from the second end of the object to the first end of the object to form a sixth layer that is a deposition of only the third evaporating source material, a seventh layer that is a deposition of a mixture of the second evaporating source material and the third evaporating source material, an eighth layer that is a deposition of only the second evaporating source material, a ninth layer that is a deposition of a mixture of the first evaporating source material and the second evaporating source material, and a tenth layer that is a deposition of only the first evaporating source material.

12. The method of claim 10, wherein the multilayer thin film is a light emitting layer, the first evaporating source material is a first host material, the second evaporating source material is a dopant, and the third evaporating source material is a second host material.

13. The method of claim 4, wherein the multilayer thin film is a light emitting layer, the first evaporating source material is a host material, and the second evaporating source material is a dopant.

14. A method of forming a multilayer thin film, comprising:

preparing a first evaporating source evaporating for a first evaporating source material in a first projection onto a first deposition region, a second evaporating source for evaporating a second evaporating source material in a second projection onto a second deposition region to obtain a first overlapping region in which the second deposition region completely overlaps the second deposition region, and a third evaporating source for evaporating a third evaporating source material onto a third deposition region to obtain a second overlapping region in which the third deposition region completely overlaps the second deposition region, wherein the first evaporating source material, the second evaporating source material, and the third evaporating source material are different from each other, and the first evaporating source, the second evaporating source, and the third evaporating source are attached to a base together with a first angle limiting component and a second angle limiting component;

driving the base in a horizontal direction;

limiting the first projection and the second projection with the first angle limiting component extending from the base for a first length in a vertical direction, the first angle limiting component being between the first evaporating source and the second evaporating source, the limiting of the first projection and the second projection comprising selecting the first length; and further limiting the first projection with the second angle limiting component comprising:

a first extension extending from the base in the vertical direction, the first evaporating source being between the first angle limiting component and the first extension; and a second extension extending for a second length in the horizontal direction toward the first evaporating source, the further limiting of the first projection comprising selecting the second length;

depositing the first evaporating source material, the second evaporating source material, and the third evaporating source material onto a portion of an object to be processed;

moving the base from a first end of the object to a second end of the object to form the multilayer thin film comprising a first layer that is a deposition of a mixture of the first evaporating source material and the second evaporating source material, and a second layer that is a deposition of a mixture of the second evaporating source material and the third evaporating source material; and selecting the first and second lengths to control thicknesses of the first and second layers.

15. The method of claim 14, further comprising moving the base from the second end of the object to the first end of the object to form a third layer that is a deposition of a mixture of the third evaporating source material and the second evaporating source material, and a fourth layer that is a deposition of a mixture of the second evaporating source material and the first evaporating source material.

16. The method of claim 14, wherein the multilayer thin film is a light emitting layer, the first evaporating source material is a first host material, the second evaporating source material is a dopant, and the third evaporating source material is a second host material.

* * * * *